US005793194A

United States Patent [19]
Lewis

[11] Patent Number: 5,793,194
[45] Date of Patent: Aug. 11, 1998

[54] BIAS CIRCUIT HAVING PROCESS VARIATION COMPENSATION AND POWER SUPPLY VARIATION COMPENSATION

[75] Inventor: Edward T. Lewis, Sudbury, Mass.

[73] Assignee: Raytheon Company, Lexington, Mass.

[21] Appl. No.: 744,260

[22] Filed: Nov. 6, 1996

[51] Int. Cl.[6] .................................................. G05F 3/04
[52] U.S. Cl. ........................................ 323/312; 323/315
[58] Field of Search .............................. 323/312, 313, 323/315; 327/544

[56] References Cited

U.S. PATENT DOCUMENTS

| | | | |
|---|---|---|---|
| 4,814,686 | 3/1989 | Watanabe | 323/312 |
| 5,297,093 | 3/1994 | Coffman | 365/208 |
| 5,365,127 | 11/1994 | Manley | 326/73 |
| 5,587,655 | 12/1996 | Oyabe et al. | 323/312 |
| 5,617,056 | 4/1997 | Main et al. | 323/315 |

*Primary Examiner*—Stuart N. Hecker
*Attorney, Agent, or Firm*—Cesari and McKenna, LLP

[57] ABSTRACT

Bias networks for producing a predetermined bias current for another circuit are provided. The bias networks include compensation subcircuits which provide compensation for process variations in the transistors in the network. Circuit implementations which allow for compensation for power supply voltage variations are also provided. The bias networks include a biasing transistor and a corresponding compensation transistor on the same chip which compensation transistor will have substantially the same process variations as the biasing transistor. The compensation transistor is interposed at a node in a control path and draws current at the node such that a change in the current drawn by the compensation transistor causes a change in the input voltage of the biasing transistor to thereby adjust the bias current produced by the transistor to maintain the bias current within design specifications despite process variations. Bias circuit configurations for a cascode amplifier, a differential amplifier, and a current mirror are provided.

12 Claims, 6 Drawing Sheets

BIAS CIRCUIT HAVING PROCESS VARIATION COMPENSATION AND POWER SUPPLY VARIATION COMPENSATION

BACKGROUND OF THE INVENTION

1. Field of the Invention

This invention relates to integrated circuit design for semiconductor biasing circuits. In particular, it relates to maintaining predictable dc operating conditions which should be invariant with respect to process variations and power supply variations in the active transistors in the biasing circuit. The invention relates to including on the same chip as the biasing transistor a second transistor of the same type, the second transistor being connected in such a way that it provides compensation for process variations in the biasing transistor. More specifically, the active biasing transistor in the circuit may be a field-effect transistor (FET). The current/voltage characteristics of such transistors, such as device threshold voltages, are subject to process variations and thus can be different from anticipated design specifications. As noted, the present invention relates to compensation within the circuit for such process variations, using the same type of transistor on the same chip, which will be subject to essentially the same process variations as the active biasing transistor.

2. Description of the Prior Art

One of the more important requirements in many semiconductor circuits is the establishment of stable and predictable dc operating conditions. These conditions are provided and maintained by biasing circuits which control currents and/or voltages and thereby establish the operating points of the active transistors in the biased circuits. The biasing circuits in turn can include various transistors whose characteristics must be predictable and subject to minimal variation with respect to external factors which can affect performance. These factors include process variations and power supply variations. With respect to process variations, the integrated-circuit manufacturing process can yield substantial differences in the parameters governing the current/voltage characteristics of a biasing transistor which directly controls the current or voltage output of the biasing circuit.

Problems due to process variations are particularly acute when the current of the biasing transistor must be finely controlled. As will be understood by those skilled in the art, the magnitude of this current has a direct bearing on the operation of the circuit element that is biased by it. Therefore, it is important to establish and maintain a known bias level that is independent of lot-to-lot variations in the manufacturing process.

It has been known to correct for inherent process variations by using a complex on-chip invasive parameter adjustment which is made, after wafer processing of the integrated circuit devices, during what is known as the testing phase. This is sometimes commonly referred to as "tweaking" the design. Some manufactured integrated circuits must undergo a number of such adjustments to account for wide process variations. These adjustments are time consuming and expensive and even then, the adjustments often do not fully compensate for the process variations.

There remains a need, therefore, for compensation for process variations that does not require on-chip invasive parameter adjustments. More specifically, it is an object of the present invention to provide a biasing circuit which also has compensation for process variations in the biasing transistor which provides the current or voltage in the desired application. It is a further object of the invention to provide compensation for variations in the power supply voltage provided to the biasing transistor.

DESCRIPTION OF THE INVENTION

A. BRIEF SUMMARY OF THE INVENTION

A biasing circuit incorporating the present invention includes a compensation subcircuit having a transistor which is formed on the same semiconductor chip as the biasing transistor and thus is subject to the same process variations as the biasing transistor. In common biasing circuits, the bias current is a function of the power supply voltage and process variations in manufacturing the aforementioned biasing transistor. For example, when a FET is used as the current-controlling element, the device threshold voltage, which is strongly affected by process variations, is directly reflected in the bias current.

More specifically, a process variation can cause a change in the device threshold voltage of the transistors in a circuit such that the transistors would tend to draw more, or less, current than a specified design current. This would result in a different bias current than otherwise expected. In accordance with the present invention, this problem is solved with a bleeder circuit including a compensation transistor that is connected at a node interposed in a resistor network which provides the gate voltage to the biasing transistor. The compensation transistor will draw more or less current at the node, depending upon the same process variations as those which affect the biasing transistor.

Accordingly, if the process variations would cause the biasing transistor to tend to draw more current than design values would indicate, the same process variation will cause the compensation transistor to draw more current from the resistor network which provides the gate voltage to the biasing transistor. This in turn results in adjustment of the gate voltage of the biasing transistor thus maintaining the bias current of the biasing transistor within expected circuit design specifications despite the process variations.

Another aspect of the invention is embodied in a circuit which uses diode voltage offsets to compensate for power supply variations. More specifically, the diode voltage offsets are used to affect the compensation transistor gate voltage, which is derived from the same supply as the biasing transistor. An adjustment to the gate voltage causes an increase or decrease in the current drawn by the compensation transistor which in turn adjusts the gate voltage of the biasing transistor, thus providing a similar type of compensation for changes in the supply voltage as that provided with respect to process variations.

The invention is applicable to biasing circuits using field-effect transistors in either the depletion mode (DFET) or the enhancement mode (EFET). The invention also applies to field-effect transistors used in cascode amplifier circuits, differential amplifier circuits, and current "mirror" bias circuits.

B. BRIEF DESCRIPTION OF THE DRAWINGS

For a fuller understanding of the nature of the invention, reference should be had to the following detailed description taken in connection with the accompanying drawings, in which.

C. DETAILED DESCRIPTION OF THE INVENTION

Figure 1:
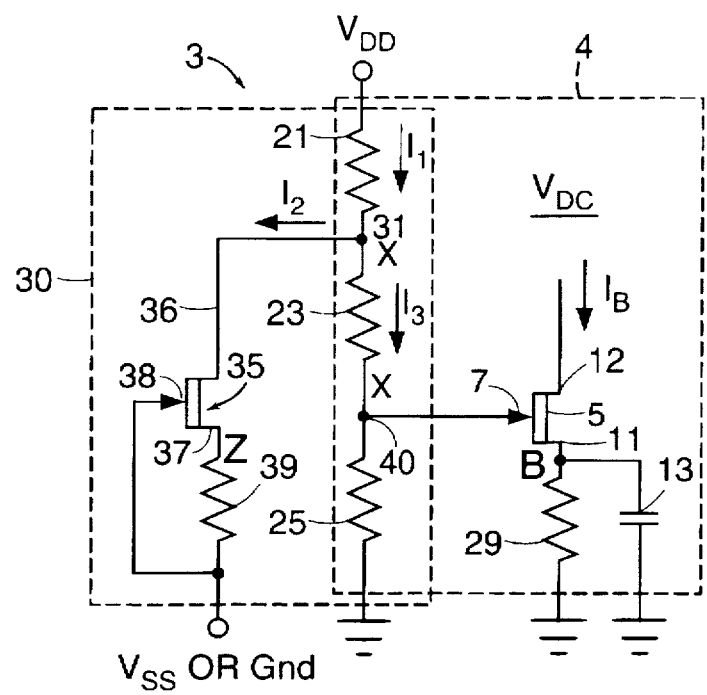
FIG. 1 depicts the bias network of the present invention for use with depletion mode field-effect transistors.

FIG. 1 illustrates a network 3, embodying the invention, including a biasing circuit shown within dashed box 4 in which a FET 5 is a biasing transistor producing bias current, $I_B$, for a separate biased circuit (not shown in the drawing). The transistor 5 is shown as a depletion mode field-effect transistor (DFET) having a gate 7, a source 11 and a drain 12. A resistor network, including resistors 21, 23 and 25, is connected between a positive power supply voltage, $V_{DD}$, and ground. The gate 7 of DFET 5 is connected to the junction of resistors 23 and 25. The resistor values are selected to provide a suitable control voltage at the gate 7 of DFET 5. The potential labelled $V_{DC}$ in FIG. 1 represents the dc drain bias of the transistor used in the circuit being biased by the circuit of FIG. 1 (not shown in the drawing).

As will be understood by those skilled in the art, in a depletion mode FET, the gate-source voltage must be negative in polarity in order to establish a drain-source current. To accomplish this, a resistor 29 is connected between source 11 of DFET 5 and ground. The voltage drop across this resistor provides a positive voltage at the source 11 that is greater than the gate potential, thus providing the desired gate-source polarity. It may also be preferred to provide a bypass capacitor 13 for those applications where DFET 5 is an active input transistor to another device (not shown).

As noted, the bias current, $I_B$, provided by biasing transistor 5 varies considerably with process variations, particularly those affecting the device threshold voltage. Variations in the power supply to the biasing circuit will also affect the bias current. The variation of $I_B$ as a function of both the device threshold voltage, $V_P$ and $V_{DD}$ in the circuit illustrated within dashed box 4 in FIG. 1 can be expressed as follows:

$$\Delta I_B = gm_5* \left( \frac{R_{25}}{R_{21}+R_{23}+R_{25}} \Delta V_{DD} - \Delta V_P \right) \quad (1)$$

In the following description, each resistance has a subscript corresponding to the reference character for the corresponding resistor in the circuit drawing, and each transconductance term, gm, has a subscript corresponding to the reference character for the corresponding transistor in the circuit drawing. For example, in Equation (1), $R_{21}$ represents the resistance of resistor 21.

And, in Equation (1), $$gm_5* = \frac{gm_5}{1+R_{29}gm_5} \quad (2)$$

where $R_{29}$ is the value of resistor 29, and $gm_5$ is the transconductance of DFET 5.

It will be appreciated from Equation (1) that any deviation in the device threshold voltage $\Delta V_P$ is strongly reflected in a change in the bias current, $I_B$. The source resistor 29 does provide some intrinsic bias stability with respect to variations in $gm_5$. However, no direct compensation is available in the circuit for process variations resulting in a deviation in the device threshold voltage, $V_P$ from expected design values.

In accordance with the present invention, process variation compensation is provided by bleeder subcircuit 30 of FIG. 1. The subcircuit includes a depletion mode field-effect transistor 35 having a drain 36, a source 37 and a gate 38. DFET 35 is made on the same chip as DFET 5 and thus is subject to the same process variations as DFET 5. The drain 36 of DFET 35 is connected at the junction of resistors 21 and 23 in the resistor network. A source resistor 39 is coupled between the source 37 of DFET 35 and either a negative power supply, $V_{SS}$, or ground, and a connection is made between one end of resistor 39 at the gate of DFET 35 and $V_{SS}$ or ground to establish the appropriate negative gate-source voltage for the operation of DFET 35, in a manner similar to that discussed with reference to DFET 5.

In operation, assume that the actual device threshold voltage of the transistors in the circuit is such that the bias current of DFET 5 would tend to be greater than expected. In order to maintain a constant bias current $I_B$ at the drain of DFET 5, the voltage at the gate of DFET 5 must be reduced. Otherwise, as noted, the bias current may be greater than expected design specifications.

In such a case, the drain current $I_2$ of DFET 35 is also greater because its device threshold voltage is affected by the same process variation as that affecting DFET 5. DFET 35 thus draws more current at node 31. As a result, the current $I_3$ is reduced. This, in turn, reduces the voltage at node 40 in the circuit of FIG. 1, i.e., the gate voltage of DFET 5. This results in the bias current $I_B$ being maintained at the specified design level, instead of a deviation in $I_B$ which would otherwise have existed due to the process variation.

The dependence of the bias current, $I_B$, upon $\Delta V_P$ and $\Delta V_{DD}$ in the circuit of FIG. 1 can be expressed as follows:

$$\Delta I_B = \quad (3)$$

$$gm_5* \left[ \left( \frac{R_{25}}{R_{21}+R_{23}+R_{25}} \right) \Delta V_{DD} + \left( \frac{R_{21}R_{25}gm_{35}*}{R_{21}+R_{23}+R_{25}} - 1 \right) \Delta V_P \right]$$

where $$gm_{35}* = \frac{gm_{35}}{1+R_{39}gm_{35}}, \quad (4)$$

and where $gm_{35}$ is the transconductance of DFET 35.

As is apparent from Equation (3), the $\Delta V_P$ multiplier contains terms that can be adjusted to render the bias current substantially insensitive to variations in this parameter by setting the numerator of the fractional $\Delta V_P$ multiplier term equal to the denominator such that the multiplier equals zero.

Figure 2:
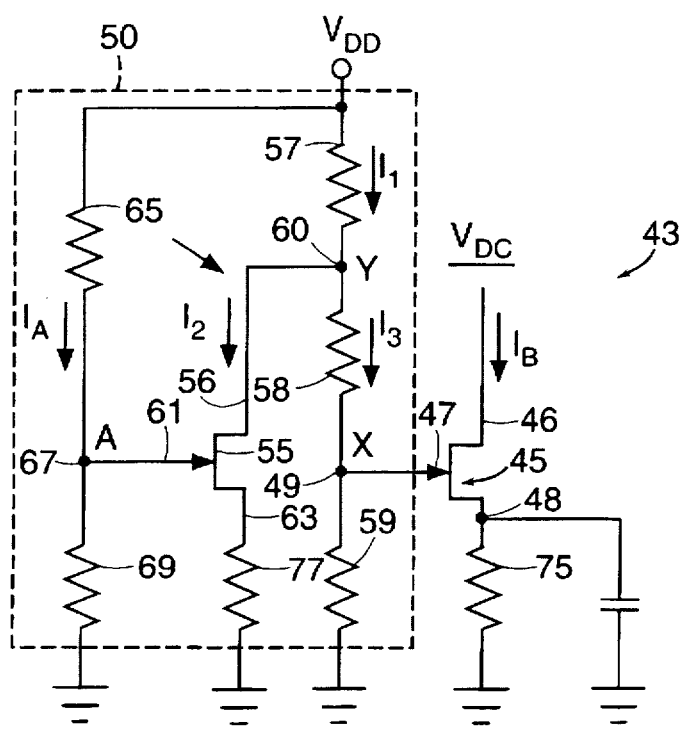
FIG. 2 depicts the bias network of the present invention using enhancement mode field-effect transistors.

A biasing circuit 43 embodying another aspect of the present invention, configured for use with enhancement mode field-effect transistors (EFETs), is illustrated in FIG. 2. A biasing transistor 45 is an EFET which produces a bias current $I_B$ for another circuit (not shown) and which has a drain 46, a gate 47 and a source 48. As will be understood by those skilled in the art, in the enhancement mode of operation, a positive gate-source voltage $V_G$ is required for channel conduction in the transistor. Accordingly, a resistor network including resistors 57, 58 and 59, which provides a gate voltage for transistor 45, is provided with the resistance values which, along with the value of optional source resistor 75, establishes the proper polarity for the biasing transistor 45.

The circuit of FIG. 2 also includes a bleeder subcircuit 50, which has a second enhancement mode transistor, EFET 55, configured as a compensation transistor. Again, the EFET 55 is included on the same chip as the biasing transistor 45 and is thus subject to the same process variations as the biasing transistor. EFET 55 has a drain 56 connected to the junction of resistors 57 and 58. The gate 61 of EFET 55 is connected to the junction of resistors 65 and 69, which are connected between the voltage source $V_{DD}$ and ground, to establish the desired control voltage for this transistor. A source resistor 77 may be included, if desired, to provide some bias stability, but it is not functionally required for the purposes of this invention.

In operation, assume, for example, that biasing transistor 45 has a device threshold voltage which is affected by process variations such that the transistor tends to draw more current than the specified design value. In that case, EFET 55 also has a device threshold voltage which will cause it to draw more current. EFET 55 therefore draws more current $I_2$ from the control path. As discussed herein, this has the effect of reducing current $I_3$, thus, resulting in a reduction in the gate voltage of biasing transistor 45. Correspondingly, as the gate voltage decreases, the bias current is maintained in accordance with original design specifications. The reverse process occurs if $V_P$ varies in the opposite direction.

For the circuit of FIG. 2, the effects on the bias current $\Delta I_B$ due to both process variations and variations in the power supply voltage may be expressed as follows:

$$\Delta I_B = gm_{45}* \left[ \frac{R_{59}}{R_{57}+R_{58}+R_{59}} \left( 1 - \frac{R_{57}R_{69}gm_{55}*}{R_{65}+R_{69}} \right) \Delta V_{DD} + \left( \frac{R_{57}R_{59}gm_{55}*}{R_{57}+R_{58}+R_{59}} - 1 \right) \Delta V_P \right] \quad (5)$$

where $$gm_{55}* = \frac{gm_{55}}{1+R_{77}gm_{55}} \quad (6)$$

As will be understood by those skilled in the art upon reference to Equation 5, the term multiplying $\Delta V_P$ again contains terms that can be adjusted to render the bias current $I_B$ essentially insensitive to variations in process parameters that affect $V_P$.

Figure 3:
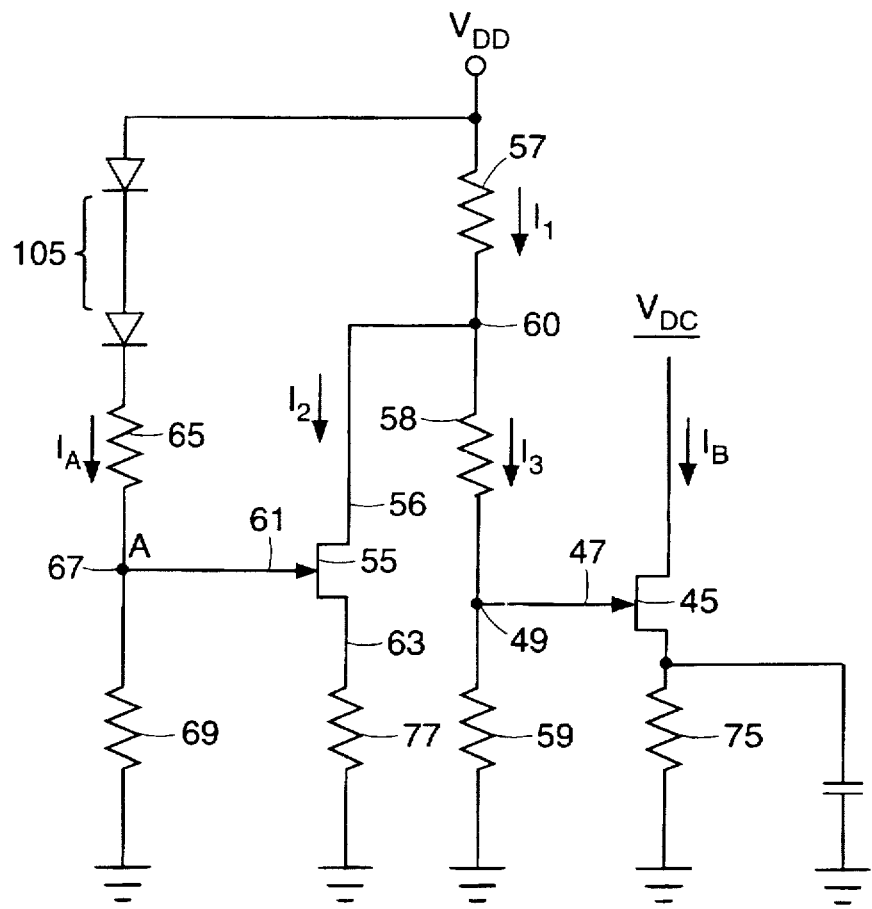
FIG. 3 depicts the bias network of FIG. 2 also including diode voltage offsets to compensate for variations in supply voltage.

The circuit of FIG. 2 also offers the opportunity to make the bias current $I_B$ insensitive to changes in power supply voltage, $\Delta V_{DD}$. This can be accomplished by adjusting the $R_{65}$, $R_{69}$ ratio with the assistance of diode voltage offsets as shown in FIG. 3. More specifically, the circuit configuration shown in FIG. 3 is the same as that of FIG. 2, except for the addition of a diode or a series of diodes, designated generally by reference character 105, coupled in series with the resistor 65 between the voltage source $V_{DD}$ and the gate 61 of EFET 55.

A fixed voltage offset of between about 0.6 to 0.8 volts is provided by each diode in the diode series 105. This subtracts from the voltage $V_{DD}$. Accordingly, for a given percentage variation in the power supply voltage $V_{DD}$, there is a greater percentage change in the voltage swing across the combination of resistors 65 and 69, and correspondingly, a greater percentage change in the gate voltage of the compensation transistor 55. The percentage change in the latter gate voltage is also greater than the percentage change in the gate voltage of biasing transistor 45, as the latter voltage undergoes the same percentage change as $V_{DD}$. Therefore, the change in the current $I_2$ as a result of a variation in $V_{DD}$ can change the current $I_3$ sufficiently to essentially eliminate the change in the transistor 45 gate voltage which would have resulted from the power supply variation. This compensation is in addition to any compensation for process variations already provided in the circuit as discussed with reference to FIG. 2.

It will be apparent to those skilled in the art that each circuit embodying the invention can be implemented using a variety of types of transistors and resistor values depending upon the application circuit that is biased by it. Several specific examples of values for the components in the circuits illustrated in FIGS. 1 through 3 will now be discussed.

As a first example, consider a circuit using depletion mode field-effect transistors such as the circuit illustrated in FIG. 1 and providing a fixed bias current, $I_B$, of two milliamperes (ma). The FETs 5 and 35 may have a threshold voltage, $V_P$, which varies from between about −0.6 volts (v) to −0.9 v due to process variations, with the nominal threshold voltage being about −0.75 v. The values for the resistors in this circuit may be as follows:

$R_{29}$ 470 ohms (Ω)

$C_{13}$ 10 picafarads (pf)

$R_{21}$ 2.27 kilo-ohms (kΩ)

$R_{23}$ 18.2 kΩ

$R_{25}$ 6.80 kΩ

$R_{39}$ 258 Ω

This will yield a maximum bias current $I_B$ variation of about +/−1% over the above-stated range of threshold voltages compared with a range of about +/−10% without the compensation subcircuit 30 of FIG. 1. Further, $I_B$ will deviate only between 1.8 ma to 2.1863 ma over a variation in $V_{DD}$ of +/−10%.

A second example relates to the EFET circuit configuration illustrated in FIG. 2. A simulation shows that the device thresholds of the EFETs can vary from between about −0.05 volts to +0.15 volts. In one arrangement in which it is preferred to establish a bias current of about 5 ma, the resistor values may be as follows:

$R_{75}$ 150 Ω

$R_{57}$ 5.33 kΩ

$R_{58}$ 9.86 kΩ

$R_{59}$ 10.14 kΩ

$R_{65}$ 30.63 kΩ

$R_{69}$ 5.37 kΩ

$R_{77}$ 1.80 kΩ

In such a case, the $I_B$ deviation due to process variations in device threshold voltage is about 5 ma to 5.01 ma, which is about 0.2% over the range of threshold voltages.

In this configuration the sensitivity of the bias current $I_B$ to variations in power supply, $V_{DD}$, amounts to about 1.45 ma/v and even this small variation can be essentially eliminated using the circuit configuration illustrated in FIG. 3, which includes the diode voltage offsets. The latter circuit provides a high degree of bias stability with respect to both process variations and power supply variations. For example, it may be preferred to use a single diode, with resistors having the same values as stated in the previous example, with the exception of $R_{65}$ which will preferably range from between about 9 kΩ and 15 kΩ, depending upon the diode voltage drop. In such a case, the change in bias current $I_B$ will be about +/−1.6% over a power supply voltage range of about 3.3 volts to 3.9 volts.

Figure 4:
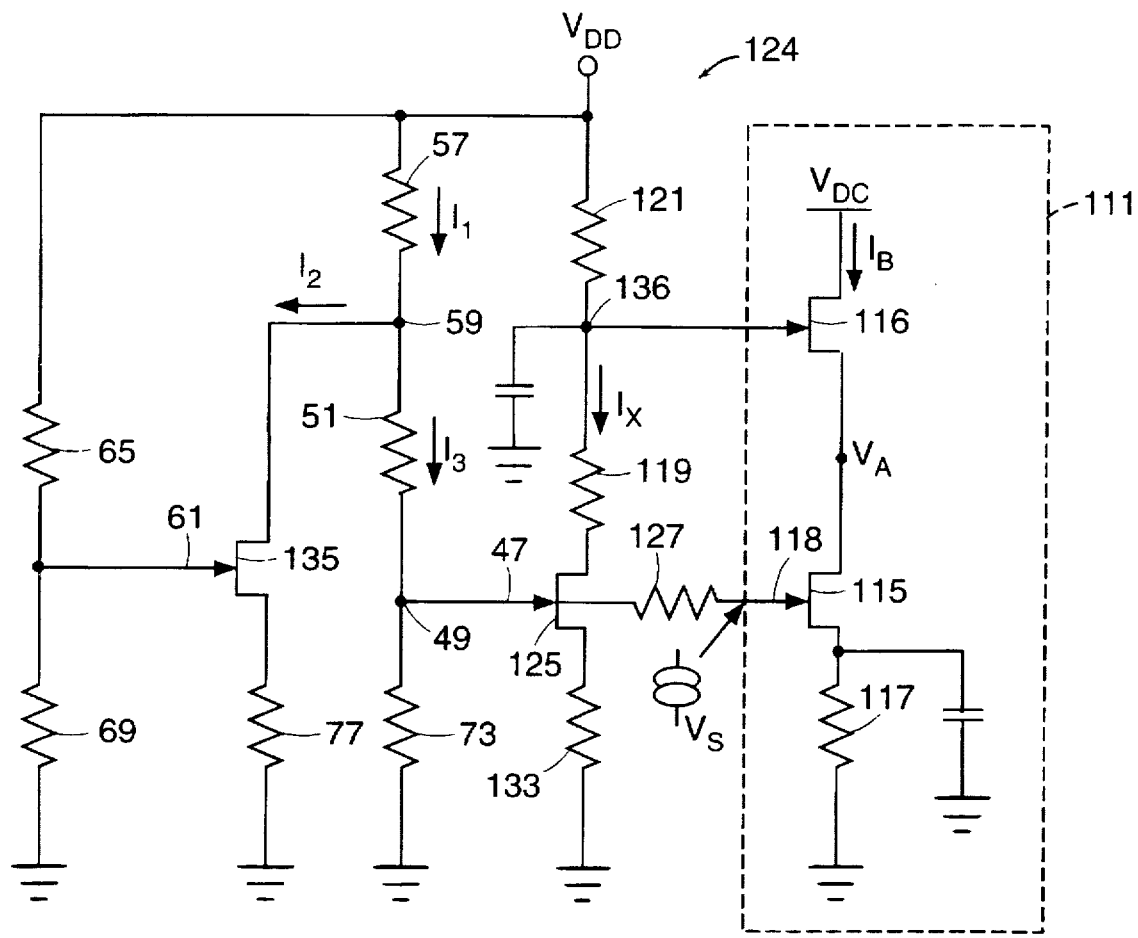
FIG. 4 depicts the biasing network of the present invention adapted for use with a cascode EFET amplifier.

Biasing circuits embodying the present invention can be used in a variety of applications. FIG. 4 illustrates a bias network for a cascode amplifier. A cascode amplifier 111 includes an amplifier transistor 115 and a current biasing transistor 116. The transistor 115 receives an input signal $V_S$ at its gate 118 for amplification. A bias voltage for transistor 115 is applied at the gate 118 as discussed in more detail below. An optional source resistor 117 may be included to provide stability.

The circuit of FIG. 4 also includes bias control circuit 124. A bias control circuit 124 includes an intermediate transistor 125. Transistor 125 produces a current $I_x$ which, along with the voltage drop across resistors 119 and 121, sets the gate voltage for biasing transistor 116. The gate voltage of intermediate transistor 125 also serves as the bias voltage of transistor 115. More specifically, the gate voltages for transistors 115 and 125 are provided by the voltage drop across resistors 51 and 73 resulting from the current $I_3$. With respect to amplifier transistor 115, a resistor 127 is connected at gate 118 to isolate the input signal $V_s$ from bias control circuit 124.

The bias network of FIG. 4 also includes a compensation subcircuit including compensation transistor 135 which is connected in a manner similar to that described with reference to FIG. 2. Transistor 135 is made on the same chip as the other transistors in the circuit and is thus subject to the same process variations as those transistors.

In operation, assume that each transistor tends to draw more than the specified current due to a process variation. In such a case, compensation transistor 135 draws more current $I_2$. As a result, $I_3$ is reduced. This, in turn, reduces the gate voltage of transistors 115 and 125. Accordingly, compensation for the characteristics of those transistors is provided and the current of those transistors remains constant. Since the current $I_X$ is unchanged, the gate voltage of transistor 116 is also unchanged. However, the internode voltage $V_a$ rises somewhat which reduces the control voltage of transistor 116 and thus provides substantial compensation for the latter transistor.

Figure 5:
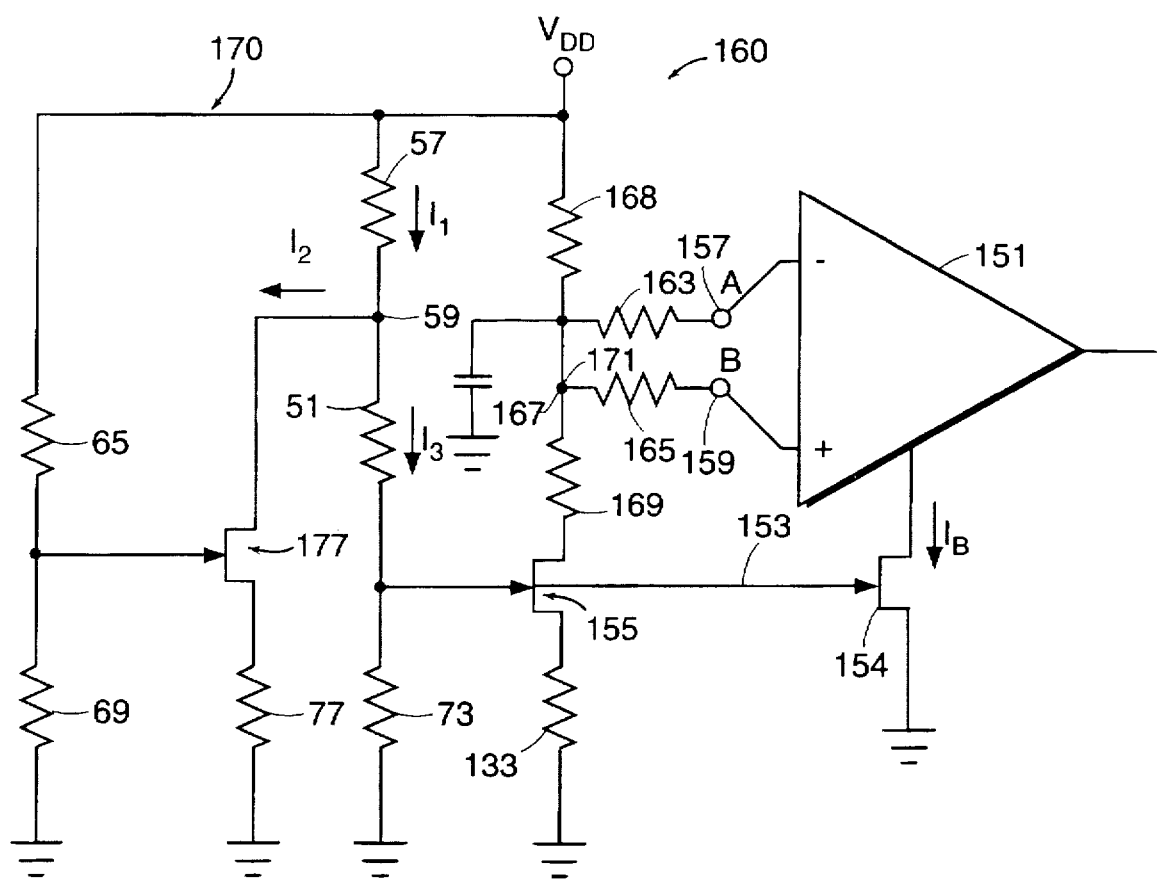
FIG. 5 depicts the bias network of the present invention including an EFET bias network for use with a differential amplifier.

FIG. 5 illustrates a bias network for a differential amplifier. The circuit includes a differential amplifier 151 which has an internal bias current $I_B$ controlled by means of EFET 154. The signals to be amplified by differential amplifier 151 are applied at ports 157 and 159.

The circuit of FIG. 5 includes a bias control circuit 160 having an intermediate transistor 155. The bias control circuit is similar to that of FIG. 4. However, in the circuit of FIG. 5, the network directly compensates for variations in the current-bearing transistor, whereas the bias network of FIG. 4 compensates for variations in the amplifier transistor.

Referring to FIG. 5, a bias voltage is to be applied at nodes 157 and 159 of differential amplifier 151. This voltage is set by the current drawn by intermediate transistor EFET 155 and the resulting voltage drop across resistor 169. Isolation resistors 163 and 165 may also be provided to isolate the input signals from the bias control circuit 160.

Process variation compensation is provided by the bleeder subcircuit 170 which includes compensation transistor 177. In a manner similar to that discussed with reference to FIGS. 1 through 3, assume that the transistors in the circuit tend to draw more than the specified current due to a process variation. The compensation transistor 177 will draw more current $I_2$ from the control path, which includes resistor 51. In turn, bias path current $I_3$ is reduced. Correspondingly, the gate voltage of transistors 154 and 155 is adjusted to a level that is lower than it would otherwise be. This substantially prevents a change in the currents drawn by these transistors. The bias voltage for the amplifier 151 is thus maintained at its design level.

In the circuit configuration illustrated in FIG. 5, the current-biasing transistor 154 is preferably an enhancement-mode field-effect transistor. However, it should be understood that the other transistors in the circuit may be either enhancement-mode or depletion-mode transistors with appropriate corresponding adaptations.

Figure 6:
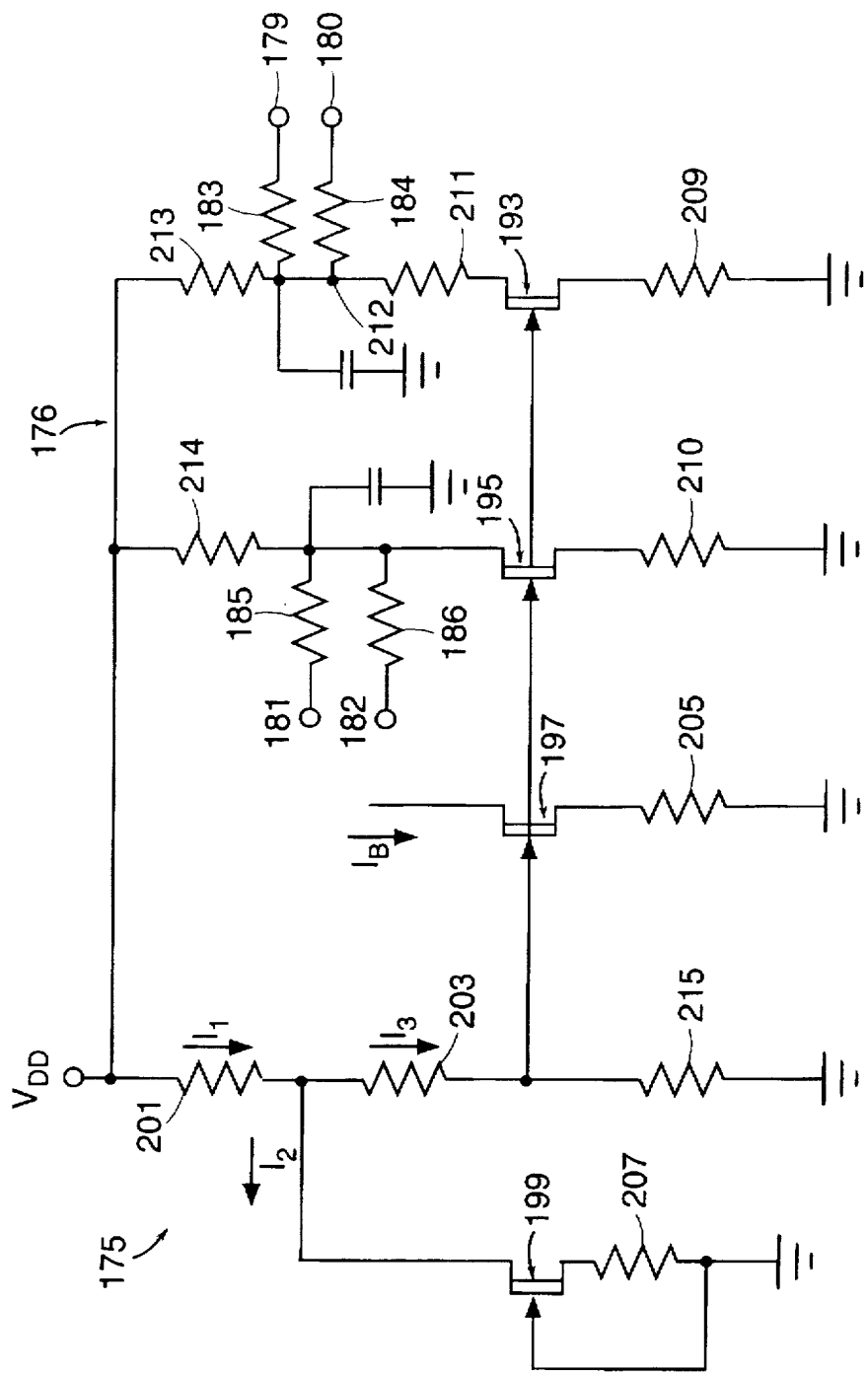
FIG. 6 depicts the bias network of the present invention using a DFET bias network for use with DFET-based differential amplifiers with stacked input ports.

Another circuit, embodying the invention, configured for use with differential amplifiers is shown in FIG. 6. A bias network 175 including depletion mode field-effect transistors provides the bias current and voltages for a DFET-based differential amplifier with stacked input ports.

The bias network 175 includes a bias control circuit 176 having two sets of input signal ports 179, 180 and 181, 182 at which input signals are applied to a differential amplifier (not shown in the drawing). Bias control circuit 176 includes two bias control transistors 193 and 195. Transistor 193 provides a current which, with the resulting voltage drop across resistor 213, sets the bias voltage for the first set of input ports 179, 180 of the differential amplifier. Isolation resistors 183 and 184 are provided to isolate the input signal from the bias control circuit 176. The second bias control transistor 195 provides a current which, with the resulting voltage drop across resistor 214, sets the bias voltage for the second set of input ports 181, 182. Resistors 185 and 186 similarly isolate the input signal from the bias control circuit 176.

Biasing current $I_B$ for the amplifier is provided by transistor 197. A source resistor 205 is connected between biasing transistor 197 and ground to establish the correct polarity for DFET operation as in the circuit of FIG. 1.

In a manner similar to that which was described with reference to FIG. 1, a bleeder subcircuit which includes compensation transistor 199 compensates the bias transistors in FIG. 6. The transistors 193, 195 and 197 thereby operate to provide current at specified design levels.

Figure 7:
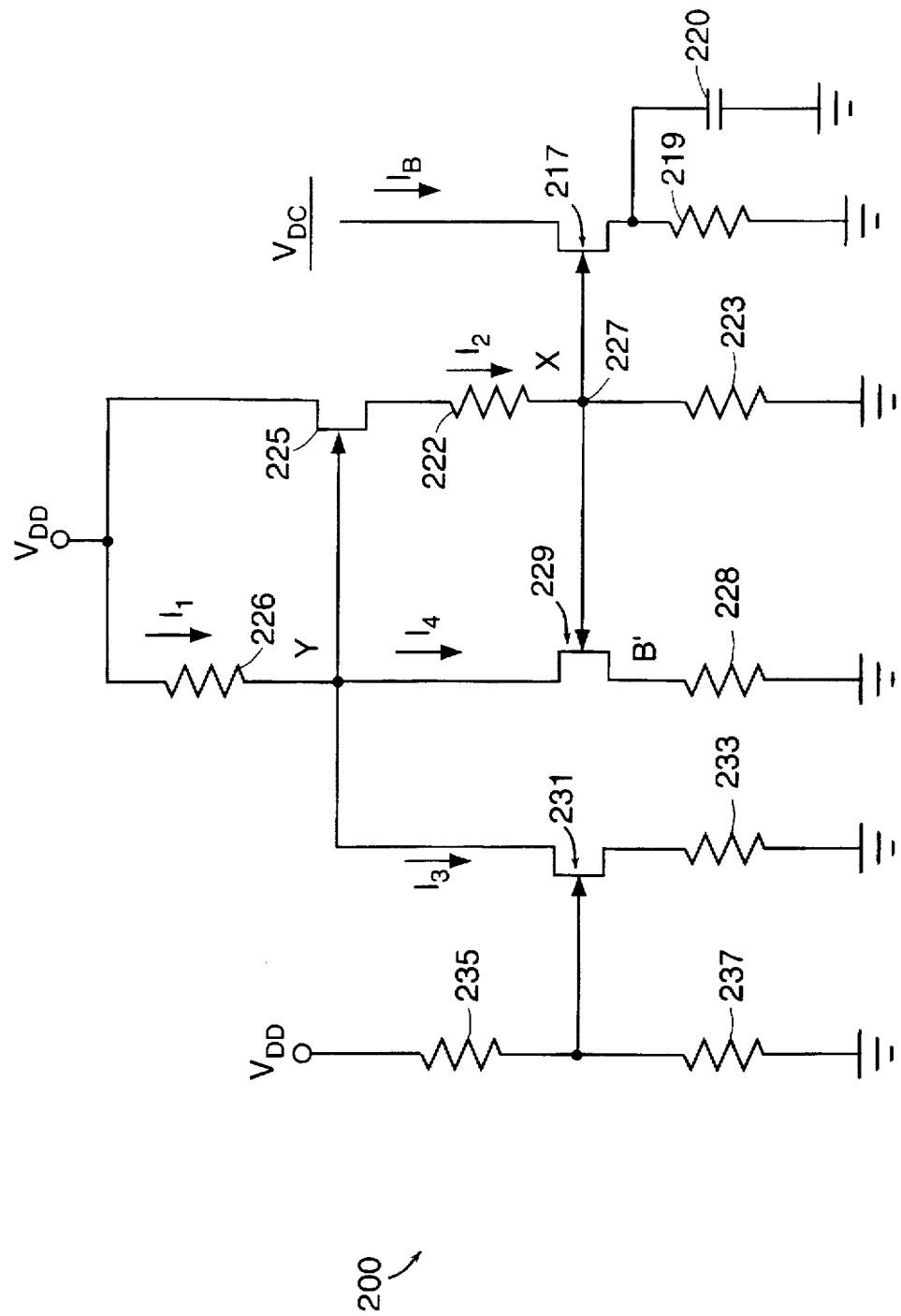
FIG. 7 depicts the bias network of the present invention using EFET-configured current mirror bias circuits.

FIG. 7 illustrates a current mirror bias circuit 200 embodying the invention. Bias current $I_B$ is produced by EFET 217. EFET 217 can be provided with an optional source resistor 219 and bypass capacitor 220, connected as shown. The circuit also includes a control transistor 225 and feedback transistor 229. Transistors 225 and 229 are connected in such a manner that the potential at node X is the gate potential of both transistor 229 and the biasing transistor 217. Transistor 229 is connected in such a manner that it has a feedback effect upon the control transistor 225 as discussed herein.

In addition, a bleeder subcircuit having compensation transistor 231 is provided. Again, the compensation transistor 231 is made on the same chip as the other transistors in the circuit and is thus subject to the same process variations as those transistors.

In operation, with respect to process variations, if the process variation is such that the transistors would tend to draw more current than design specifications would indicate, the compensation transistor 231 will also draw more current $I_3$. An adjustment in current $I_3$ will result in an adjustment in the gate voltage to transistor 225 which produces current $I_2$. As both the gate voltage for biasing transistor 217 and the feedback transistor 229 vary with $I_2$, this means that compensation is provided to both transistors.

Moreover, feedback is provided by transistor 229 in the case of a variation in the power supply voltage $V_{DD}$. More specifically, assume a variation in power supply causes an increase in the voltage at node Y, which is the gate voltage of transistor 225. In such a case, transistor 225 would draw more current. This would increase the voltage at node X in the circuit. An increase in that voltage will cause feedback transistor 229 to draw more current $I_4$ which tends to bring the voltage at node Y back down. When this voltage, i.e., the gate voltage of transistor 225, is reduced, the current drawn by transistor 225 will tend to remain at or substantially equal to the specified design current despite the power supply variation.

Further, it will be understood by those skilled in the art that both process variation and power supply variation compensation are provided in the circuit illustrated in FIG. 7, as is shown as follows in Equation (7):

$$\Delta I_B = \left[ \frac{gm_{217}{}^*}{1 + R_{226}gm_{229}{}^* + (R_{223}gm_{225}{}^*)^{-1}} \right] \left[ \Delta V_{DD}\left(1 - \frac{R_{226}R_{237}}{R_{235} + R_{237}} gm_{231}{}^*\right) - (2 + (R_{223}gm_{225}{}^*)^{-1} - R_{226}gm_{231}{}^*)\Delta V_P \right]$$

As can be seen from the equation, the terms multiplying $\Delta V_{DD}$ and $\Delta V_P$ can be adjusted such that the term will equal zero thereby illustrating that compensation for these variations is available.

A biasing circuit configuration having process variation compensation can be readily adapted for use with a combination of EFETs and DFETs in which a DFET is used in place of EFET 225 in FIG. 7 with appropriate adjustments to the resistors in the circuit.

As will be understood by those skilled in the art, the compensation circuit of the present invention will be readily applicable to many types of integrated circuits in which a transistor is producing a predetermined current as a bias current for another application circuit. The circuit of the present invention compensates for variations in process parameters such as device threshold voltage. The invention is also applicable to circuit implementations which include compensation for power supply variations. The circuit configurations embodying the invention substantially enhance circuit performances by compensating for variations, particularly in process parameters, but also in power supply voltages.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An integrated circuit for a bias network for producing a predetermined bias current for an another circuit, said bias network having a power supply associated therewith, the network comprising:

(A) a biasing transistor which is a field-effect transistor having a gate, a source and a drain, said biasing transistor producing a predetermined level of bias current that corresponds to an input gate-source voltage applied to said biasing transistor;

(B) control means connected to the biasing transistor, said control means including a resistive control path through which a current is produced to provide said biasing transistor input voltage; and (C) compensating means connected to said control means, said compensating means including a compensation transistor which is the same type of transistor as said biasing transistor, wherein said compensation transistor diverts current from said control path whereby process variations cause the compensation transistor to draw a current of a magnitude such as to provide an input voltage to the biasing transistor such that said transistor provides said predetermined level of bias current.

2. An integrated circuit for a bias network for producing a predetermined bias current for another circuit, said bias network having a power supply associated therewith, the circuit comprising:

(A) a biasing transistor which is a field-effect transistor having a gate, a source and a drain, said biasing transistor producing a predetermined level of bias current that corresponds to an input gate-source voltage applied to said biasing transistor;

(B) control means connected to the biasing transistor, said control means including a resistive control path which includes a plurality of resistors with at least a first resistor connected between said power supply and, through a first node, to a second resistor that is connected at a second node to a third resistor, and said gate of said biasing transistor being connected at said second node whereby said biasing transistor input voltage is controlled by the current through said control path; and (C) compensating means connected to said control means, said compensating means including a compensation transistor which is the same type of transistor as said biasing transistor, and said compensation transistor has a drain connected at said first node, such that current drawn by said compensation transistor controls the current in said control path whereby process variations cause the compensation transistor to draw a current of a magnitude such as to provide an input voltage to the biasing transistor such that said biasing transistor provides said predetermined level of bias current.

3. The integrated circuit defined in claim 2, wherein:
said compensating means includes a voltage divider connected to said power supply and providing the gate voltage for said compensation transistor.

4. The integrated circuit defined in claim 3, wherein:
said compensating means includes at least one diode connected between said voltage divider and said power supply.

5. The integrated circuit defined in claim 2:

(A) further comprising a differential amplifier having a first pair of input ports for receiving an input signal, said biasing transistor being a current-biasing transistor producing said predetermined bias current for said differential amplifier; and (B) wherein said control means includes an intermediate field-effect transistor and a second resistive path, said second resistive path being in series with the drain-source path of said intermediate transistor and said power supply, said input ports of said differential amplifier being coupled to a first node in said second resistive path such that the current provided by said intermediate transistor controls the bias voltage for said differential amplifier, the gate of said intermediate transistor being connected to said resistive control path such that the current in said resistive control path controls the input voltage for said intermediate transistor.

6. The integrated circuit of claim 5, wherein (A) said resistive control path includes a plurality of resistors with at least a first resistor connected between said power supply and, through a second node, to a second resistor that is connected at a third node to a third resistor, and said gate of said intermediate transistor and the gate of said current-biasing transistor being connected at said third node whereby said current-biasing transistor input voltage and said intermediate transistor input voltage are controlled by the current through said control path;

(B) said second resistive path includes a fourth resistor connected between said power supply and, through said first node, to a fifth resistor which is connected between said first node and the drain of said intermediate transistor; and (C) said compensation transistor has a drain connected at said second node, such that current drawn by said compensation transistor controls the current in said control path.

7. The integrated circuit of claim 6, wherein (A) said differential amplifier includes a second pair of input ports for receving a second input signal;

(B) said control means includes a second intermediate field-effect transistor associated with said second pair of input ports, and a third resistive path, said third resistive path being in series with the drain-source path of said second intermediate transistor and said power supply, and said second pair of input ports of said differential amplifier being coupled to a node in said third resistive path such that the current provided by said second intermediate transistor controls the bias voltage for said second pair of input ports of said differential amplifier, the gate of said second intermediate transistor being connected to said resistive control path of said control means such that the current in said resistive control path controls the input voltage for said second intermediate transistor.

8. The integrated circuit defined in claim 7, wherein (A) said resistive control path of said control means includes a plurality of resistors with at least a first resistor connected between said power supply and, through a third node, to a second resistor that is connected at a fourth node to a third resistor, and said gate of said current-biasing transistor being connected at said fourth node, whereby said current-biasing transistor input voltage is controlled by the current through said control path; and (B) said compensation transistor has a drain connected at said third node, such that current drawn by said compensation transistor controls the current in said control path.

9. An integrated circuit for a current mirror bias network for producing a predetermined bias current for an another circuit, said bias network having a power supply associated therewith, the network comprising:

(A) a biasing transistor which is a field-effect transistor having a gate, a source and a drain, said biasing transistor producing a predetermined level of bias current that corresponds to an input gate-source voltage applied to said biasing transistor;

(B) current-mirror feedback means for establishing said biasing transistor input voltage, said current-mirror feedback means including 1) a control field-effect transistor connected to said power supply and connected to a resistive current path, the gate of said biasing transistor being connected to a first node in said current path, whereby the input voltage of said biasing transistor is controlled by the current of said control transistor, and 2) a feedback field-effect transistor coupled with said power supply to a second current path, said feedback transistor having a gate connected at said first node such that its gate voltage is also controlled by said current drawn by said control transistor, said feedback transistor having a drain connected at a second node in said second current path such that current drawn by said feedback transistor adjusts the gate voltage of said control transistor to provide compensation for variations in said power supply; and (C) compensating means connected to said current mirror feedback means, said compensating means including a compensation transistor which is the same type of transistor as said biasing transistor, said compensation transistor having a drain connected to said second current path such that said compensation transistor diverts current from said current mirror feedback means such as to provide compensation to said biasing transistor for process variations.

10. The integrated circuit defined in claim 9, wherein said compensating means includes a voltage divider connected to said power supply and providing the gate voltage for said compensation transistor.

11. An integrated circuit for a cascode amplifier bias network, said integrated circuit having a power supply associated therewith, the network comprising:

(A) a biasing field-effect transistor connected in a cascode amplifier configuration with an amplifier field-effect transistor, an internode voltage being established between the source of said biasing transistor and the drain of said amplifier transistor;

(B) control means connected to said biasing transistor and said amplifier transistor, said control means including:

1) a resistive control path through which a current is produced to provide the input gate-source voltage for said amplifier transistor; and 2) a reference transistor and a second resistive path, said second resistive path being in series with the drain-source path of said reference transistor and said power supply, the gate of said biasing transistor being connected at a first node in said second resistive path such that the current provided by said reference transistor controls the input voltage for said biasing transistor, the gate of said reference transistor and the gate of said amplifier transistor being connected to said resistive control path such that the current in said resistive control path controls the input voltage for said reference transistor and said amplifier transistor (C) compensating means connected to said control means, said compensating means including a compensation transistor which is the same type of transistor as said biasing transistor, whereby current drawn by said compensation transistor controls current into said resistive control path such as to adjust the gate voltages of both said reference transistor and said amplifier transistor to compensate for process variations in said reference transistor and said amplifier transistor, said internode voltage changing to provide compensation to said biasing transistor.

12. The integrated circuit defined in claim 11, wherein (A) said resistive control path includes a plurality of resistors with a first resistor connected between said power supply and, through a second node, to a second resistor that is connected at a third node to a third resistor; and (B) said second resistive path having a fourth resistor connected between said power supply and a fourth node, and a fifth resistor connected between said fourth node and the drain of said reference transistor.

* * * * *